United States Patent
Razzaghi et al.

(10) Patent No.: US 9,806,729 B1
(45) Date of Patent: Oct. 31, 2017

(54) CURRENT STEERING CELL WITH CODE-DEPENDENT NONLINEARITY CANCELLATION AND FAST SETTLING FOR LOW-POWER LOW-AREA HIGH-SPEED DIGITAL-TO-ANALOG CONVERTERS

(71) Applicant: Marvell International Ltd., Hamilton (BM)

(72) Inventors: Alireza Razzaghi, Mountain View, CA (US); Arvind Anumula Paramanandam, Pleasanton, CA (US); Anuranjan Jha, San Jose, CA (US); Weiwei Xu, San Jose, CA (US); Xiaoyue Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/298,141

(22) Filed: Oct. 19, 2016

Related U.S. Application Data

(60) Provisional application No. 62/243,939, filed on Oct. 20, 2015.

(51) Int. Cl.
*H03M 1/66* (2006.01)
*H03M 1/06* (2006.01)
(Continued)

(52) U.S. Cl.
CPC ........ *H03M 1/0617* (2013.01); *H03M 1/1009* (2013.01); *H03M 1/1245* (2013.01)

(58) Field of Classification Search
CPC ...... H03M 1/66; H03M 1/742; H03M 1/0863; H03M 1/745; H03M 1/747; H03M 1/687; H03M 1/0682; H03M 3/50
(Continued)

(56) References Cited

U.S. PATENT DOCUMENTS

| | | | | |
|---|---|---|---|---|
| 8,872,685 B2* | 10/2014 | Song | ...................... | H03F 3/211 |
| | | | | 341/126 |
| 9,035,680 B2* | 5/2015 | Yang | ................... | H03K 5/2481 |
| | | | | 327/215 |

(Continued)

OTHER PUBLICATIONS

W.-H. Tseng, C.-W. Fan, J.-T. Wu, "A 12b 1.25GS/s DAC in 90nm CMOS with >70SFDR up to 500MHz", ISSCC Dig. Tech. Papers, Feb. 2011, pp. 192-193.

(Continued)

*Primary Examiner* — Linh Nguyen

(57) ABSTRACT

Systems and techniques relating to a digital-to-analog converter (DAC) are described. A described DAC cell includes a differential switch pair coupled with a cross-coupled switch pair. Gate terminals of the differential switch pair are arranged to respectively receive an input signal to the cell and an inverted version of the input signal to respectively drive the gate terminals of the differential switch pair. Gate terminals of the cross-coupled switch pair are arranged to respectively receive the input signal and the inverted version of the input signal to respectively drive the gate terminals of the cross-coupled switch pair. The cross-coupled switch pair is configured to reduce or eliminate net differential transient current between switch output terminals of the differential switch pair. A current-to-voltage converter coupled with the switch output terminals of the differential switch pair generates a voltage that forms at least a portion of an output of the digital-to-analog converter.

20 Claims, 7 Drawing Sheets

(51) Int. Cl.
*H03M 1/10* (2006.01)
*H03M 1/12* (2006.01)

(58) Field of Classification Search
USPC .................................................. 341/136, 144
See application file for complete search history.

(56) References Cited

U.S. PATENT DOCUMENTS

| | | | | |
|---|---|---|---|---|
| 9,385,742 | B1* | 7/2016 | Cheng ................... | H03M 1/742 |
| 2003/0132872 | A1* | 7/2003 | Casper ................ | H03F 3/45183 341/161 |
| 2005/0225465 | A1* | 10/2005 | Zhang ................. | H03M 1/0624 341/144 |
| 2007/0069928 | A1* | 3/2007 | Gehring ............... | H03D 7/1425 341/118 |
| 2012/0176263 | A1* | 7/2012 | Imai ................. | H03K 19/00384 341/144 |
| 2013/0015993 | A1* | 1/2013 | Santos ................ | H03M 1/0624 341/144 |
| 2014/0062621 | A1* | 3/2014 | Dai ..................... | H03H 11/481 333/216 |
| 2014/0266830 | A1* | 9/2014 | Song ...................... | H03F 3/211 341/144 |

OTHER PUBLICATIONS

G. Engel, S. Kuo and S. Rose, "A 14b 3/6GHz Current-Steering RF DAC in 0.18um CMOS with 66dB ACLR at 2.9GHz", ISSCC Dig. Tech. Papers, Feb. 2012, pp. 458-459.

S. Spiridon, H. Yan and H. Eberhart, "A Linearity Improvement Technique for Overcoming Signal-Dependent Induced Switching Time Mismatch in DAC-Based Transmitters", IEEE ESSCIRC 2015, pp. 347-347c.

C.-H. Lin, et al, "A 12b 2.9GS/s DAC with IM3 <-60dBc Beyond 1GHz in 65nm CMOS", ISSCC Dig. Tech. Papers, Feb. 2009, pp. 74-75.

J. Bastos, et al, "A 12-Bit Intrinsic Accuracy High-Speed CMOS DAC", IEEE J. Solid-State Circuits, vol. 33, No. 12, Dec. 1998, pp. 1959-1969.

Hans J. Schouwenaarsh et al. "A Low-Power Stereo 16-bit CMOS D/A Converter for Digital Audio", IEEE Journal of Solid-State Circuits, vol. 23, No. 6, Dec. 1988, p. 1290-1297.

* cited by examiner

CURRENT STEERING CELL WITH CODE-DEPENDENT NONLINEARITY CANCELLATION AND FAST SETTLING FOR LOW-POWER LOW-AREA HIGH-SPEED DIGITAL-TO-ANALOG CONVERTERS

CROSS REFERENCE TO RELATED APPLICATIONS

This present disclosure claims the benefit of the priority of U.S. Provisional Application Ser. No. 62/243,939, filed Oct. 20, 2015, and entitled "CURRENT STEERING CELL WITH CODE-DEPENDENT NONLINEARITY CANCELLATION AND FAST SETTLING FOR LOW-POWER LOW-AREA HIGH-SPEED DIGITAL-TO-ANALOG CONVERTERS," which is incorporated herein by reference in its entirety.

BACKGROUND

This disclosure relates to digital-to-analog conversion.

Various devices employ a digital-to-analog converter (DAC) to convert digital values into analog waveforms. For example, a wireless device can generate a digital communication sequence for transmission. The wireless device uses a DAC to convert the digital values of the sequence into analog signals before transmission over the air. In some implementations, a DAC include multiple cells that are assigned to and convert respective bit positions of a digital input, where the bit positions range from a most significant bit (MSB) to a least significant bit (LSB). Devices that use a DAC can include a filter to remove unwanted distortions caused by the DAC.

SUMMARY

The present disclosure includes systems and techniques for digital-to-analog conversion. According to an aspect of the present disclosure, a cell of a digital-to-analog converter includes a differential switch pair coupled with a cross-coupled switch pair. Gate terminals of the differential switch pair are arranged to respectively receive an input signal to the cell and an inverted version of the input signal to respectively drive the gate terminals of the differential switch pair. Gate terminals of the cross-coupled switch pair are arranged to respectively receive the input signal and the inverted version of the input signal to respectively drive the gate terminals of the cross-coupled switch pair. The cross-coupled switch pair is configured to reduce or eliminate a net differential transient current between switch output terminals of the differential switch pair. A current-to-voltage converter coupled with the switch output terminals of the differential switch pair generates a voltage that forms at least a portion of an output of the digital-to-analog converter.

This and other implementations can include one or more of the following features. In some implementations, the differential switch pair includes a first transistor and a second transistor; where a first terminal of the first transistor is coupled with a voltage source and a first terminal of the second transistor is coupled with the voltage source. In some implementations, the cross-coupled switch pair includes a third transistor and a fourth transistor, where a gate of the first transistor and a gate of the third transistor are arranged to receive the input signal, and a gate of the second transistor and a gate of the fourth transistor are arranged to receive the inverted version of the input signal. In some implementations, a source terminal of the third transistor is coupled with a source terminal of the fourth transistor. A drain terminal of the first transistor can be coupled with a drain terminal of the fourth transistor, and a drain terminal of the second transistor can be coupled with a drain terminal of the third transistor. Implementations can include a switch pair coupled between the switch output terminals of the differential switch pair and the current-to-voltage converter to increase output impedance. In some implementations, the digital-to-analog converter includes two or more cells, the two or more cells can be assigned to respective bit positions of a digital input value provided to the digital-to-analog converter. The two or more cells can be configured to control different current amounts that correspond to the respective bit positions. In some implementations, the current-to-voltage converter is arranged to receive a combination of outputs from the two or more cells to produce a combined voltage, and the combined voltage is an analog representation of the digital input value. In some implementations, the two or more cells are formed on a single integrated circuit chip that is susceptible to parasitic metal fringe capacitances. In some implementations, a parasitic metal fringe capacitance between differential switch pair input terminals for each of the two or more cells has been tuned to compensate for capacitive mismatches among the two or more cells. In some implementations, the DAC is implemented within a single integrated circuit chip.

The described systems and techniques can be implemented in electronic circuitry, computer hardware, firmware, software, or in combinations of them, such as the structural means disclosed in this specification and structural equivalents thereof. For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

In another aspect, a device can include a first transistor of a differential switch pair of a cell of a digital-to-analog converter, where a gate of the first transistor of the differential switch pair is arranged to receive an input signal to the cell; a second transistor of the differential switch pair, where a gate of the second transistor of the differential switch pair is arranged to receive an inverted version of the input signal, a first transistor of a cross-coupled switch pair, where a gate of the first transistor of the cross-coupled switch pair is arranged to receive the input signal; a second transistor of the cross-coupled switch pair, wherein a gate of the second transistor of the cross-coupled switch pair is arranged to receive the inverted version of the input signal, a first node coupled with a non-gate terminal of the first transistor of the differential switch pair and a non-gate terminal of the second transistor of the cross-coupled switch pair; a second node coupled with a non-gate terminal of the second transistor of the differential switch pair and a non-gate terminal of the first transistor of the cross-coupled switch pair; and a converter coupled with the first node and the second node to produce an output voltage that corresponds to the input signal.

This and other implementations can include one or more of the following features. In some implementations, a source terminal of the first transistor is coupled with a voltage source, and a source terminal of the second transistor is coupled with the voltage source. In some implementations, a source terminal of the third transistor is coupled with a source terminal of the fourth transistor via a common node, and the common node is not coupled with the voltage source. Implementations can include a switch pair coupled between the first and second nodes and the current-to-voltage converter to increase output impedance.

In another aspect, a technique can include receiving, within a cell of a digital-to-analog converter, an input signal that corresponds to at least a portion of a digital value; generating an inverted version of the input signal; driving gate terminals of a differential switch pair of the cell based on the input signal and the inverted version of the input signal; driving gate terminals of a cross-coupled switch pair of the cell based on the input signal and the inverted version of the input signal to reduce or eliminate a net differential transient current between switch output terminals of the differential switch pair; and operating a current-to-voltage converter to produce a voltage output based on the switch output terminals.

This and other implementations can include one or more of the following features. Implementations can include operating a switch pair coupled between the switch output terminals of the differential switch pair and the current-to-voltage converter to increase output impedance. Implementations can include operating two or more cells to convert a digital input value, the two or more cells including the cell, the two or more cells being assigned to respective bit positions of the digital input value, and the two or more cells being configured to control different current amounts that correspond to the respective bit positions. In some implementations, the differential switch pair includes a first transistor and a second transistor; where a first terminal of the first transistor is coupled with a voltage source and a first terminal of the second transistor is coupled with the voltage source. In some implementations, the cross-coupled switch pair includes a third transistor and a fourth transistor, where a gate of the first transistor and a gate of the third transistor are arranged to receive the input signal, and a gate of the second transistor and a gate of the fourth transistor are arranged to receive the inverted version of the input signal. In some implementations, a source terminal of the third transistor is coupled with a source terminal of the fourth transistor.

Particular configurations of the technology described in this disclosure can be implemented so as to realize one or more of the following potential advantages. A described technology can increase conversion fidelity by reducing or eliminating distortions in a DAC output. Redirecting a gate-drain capacitance transient charge flow of a differential switch pair via a cross-coupled switch pair can yield, for example, a 7.1 dBc improvement in a total harmonic distortion (THD) of a DAC's differential output current. Such a reduction can obviate the use of a complex and power-intensive post-DAC low-pass filter (LPF), such as a 5th-order Chebyshev LPF. A described technology can reduce or eliminate code-dependent switching transient (CDST) currents. A described technology can be readily implemented in an integrated circuit chip with little or no impact on the area of the chip or the chip's power consumption. A described technology can be used at GHz sampling rates, e.g., 2.56 GS/s. A described technology can be used to reduce spurs in wireline or wireless communication transmission signals, e.g., by more than 10 dB in one-tone systems and more than 5 dB for multi-tone, orthogonal frequency-division multiplexing (OFDM), based systems.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

A DAC converts a digital input value into an analog signal via components called cells. A DAC cell can be assigned to a respective bit position of the digital input value. Further, DAC cells can be coupled with current source inputs that correspond to the respective bit positions. For example, a cell associated with a more significant bit of the digital input value controls more current than a cell associated with a less significant bit. A DAC cell can include a differential switch pair for conversion of an assigned portion of the digital input value. Output currents of the cells can be combined. A current-to-voltage converter can convert the combined currents into a voltage output that is an analog representation of the digital input value.

Figure 1:
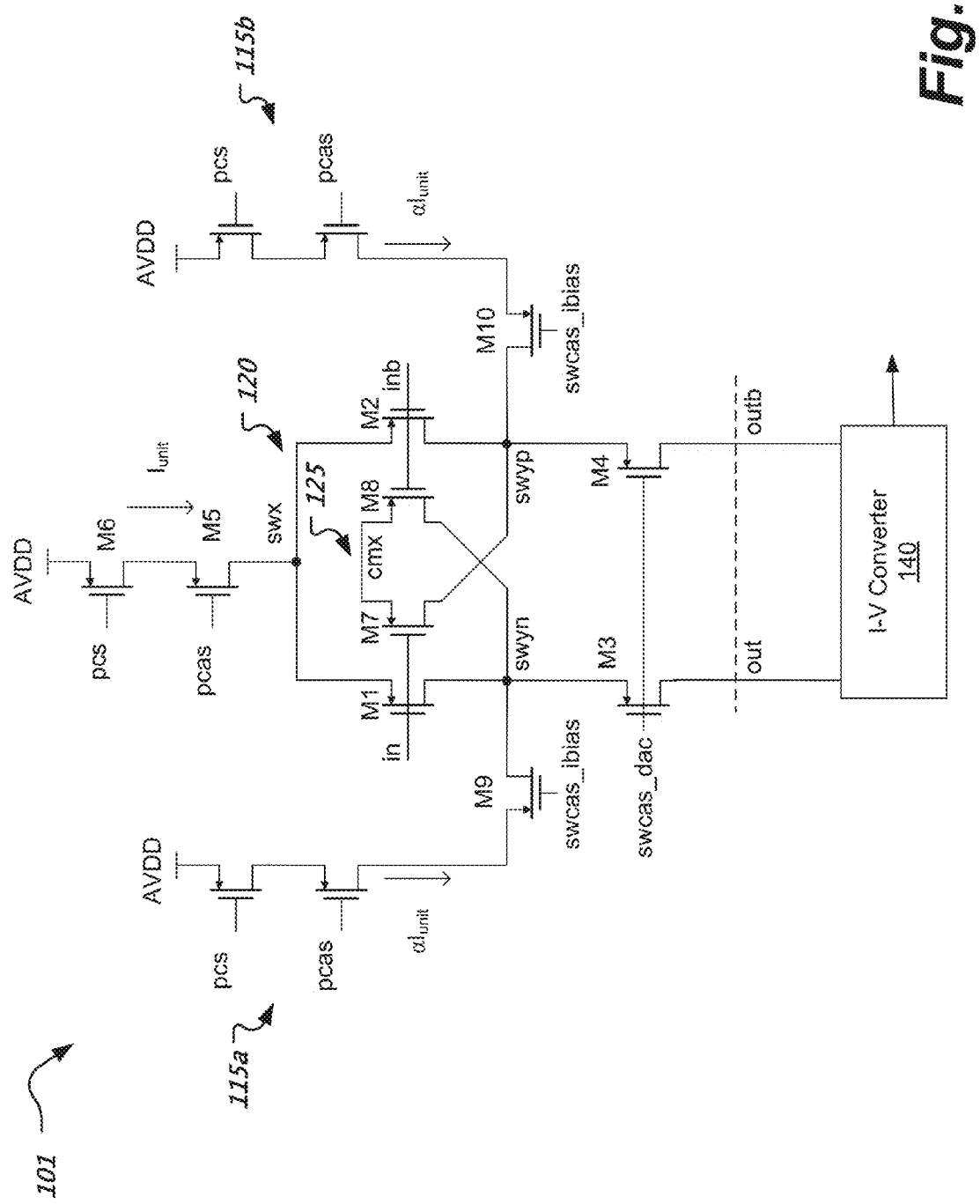
FIG. 1 shows a schematic of an example of a current-steering DAC cell that includes a differential switch pair and a cross-coupled switch pair.

FIG. 1 shows a schematic of an example of a current-steering DAC cell 101 that includes a differential switch pair 120 and a cross-coupled switch pair 125. Note that two or more current-steering DAC cells 101 can be coupled together for digital-to-analog conversion of a digital value having two or more bit positions. In some implementations, the DAC cell 101 is created using complementary metal-oxide-semiconductor (CMOS) logic. Other types of logic are possible. The DAC cell 101 includes switches called transistors labelled M1, M2, M3, M4, M5, M6, M7, M8, M9, and M10.

Transistors M1 and M2 form the differential switch pair 120 of the cell 101. The gate terminal of M1 is driven by an input signal (labelled "in") and the gate terminal of M2 is driven by an inverted version of the input signal (labelled "inb"). The input signal "in" for the DAC cell 101 corresponds to a bit position of a multi-bit digital value. In this example, the source terminals of the transistors M1 and M2 of the differential switch pair 120 are driven by the full $AV_{DD}$ (analog voltage positive supply) of the CMOS logic. Using the full $AV_{DD}$ voltage can provide steep transitions that reduce the effects of switch driver mismatch, clock jitter, and a device's electronic noise.

To ensure a good dynamic performance, a crossing point for the gate drive signals of the differential switch pair 120 can be optimized to yield a symmetric voltage excursion at node swx. This crossing point refers to when a first gate drive signal (e.g., "in" or inb") changes from a $V_{SS}$ voltage (negative voltage supply) to a $V_{DD}$ voltage (positive voltage supply) while the second gate drive signal (e.g., "inb" or "in") changes from the $V_{DD}$ voltage to the $V_{SS}$ voltage.

Transistors M1 and M2 can be operated in a triode region, also referred to as a linear region, or in a saturation region. However, transistors M1 and M2 are usually operated in the saturation region during an ON state, resulting in high output impedance and minimizing required signal swing at their gate inputs. The latter can ensure that code-dependent signal coupling to the unit cell output is minimized. However, this may require very low impedance reference voltages to provide the ON/OFF levels for the switch gates. High bandwidth of the reference voltage design can ensure that transients at the gate nodes settle within a sampling period. In some implementations, the cell 101 includes CMOS buffers and, hence, levels to drive the current-steering switches (M1/M2) at the cost of operating these switches in the linear region. To restore the output impedance for operation in the linear region, the cell 101 includes cascode transistors M3 and M4 to boost the output impedance at low frequencies and prevent the output signal excursion from appearing at a common source node labelled swx in FIG. 1. In some implementations, the cascode transistors M3 and M4 are maintained ON in a saturation region using scaled tail current $\alpha I_{unit}$, when their branch current is steered off (e.g., when M1 is OFF or when M2 is OFF), to ensure a low switching-impedance. Here, a is a scaling factor and $I_{unit}$ is the unit current assigned to the cell 101. As addressed further below, each cell 101 can have a different $I_{unit}$. In some implementations, the unit values for respective less significant cells, inclusive of the LSB, take on values $I_{lsb}$, $2I_{lsb}$, $4I_{lsb}$, $8I_{lsb}$, $16I_{lsb}$, and $32I_{lsb}$, where $I_{lsb}$ is based on a current value associated with the least significant bit cell. In some implementations, $I_{unit}$ values for more significant cells, inclusive of the MSB, take a $64I_{lsb}$ value. In some implementations, $\alpha I_{unit}$ values for different cells take values between $3I_{lsb}$ and $8I_{lsb}$ and, as a result, a values range from 0.125 to 6, however other values are possible.

The cell 101 includes tail current pathways 115a, 115b for injecting a small fraction (a) of the tail current $I_{unit}$. The tail current pathways 115a-b include a pair of transistors for creating the scaled current ($\alpha I_{unit}$), the transistors being controlled by input signals labelled pcs and pcas respectively. In some implementations, the pcs and pcas inputs can be calibrated based on the scaled current requirements of the cell 101. Transistors M9 and M10 of respective tail current pathways 115a-b inject the scaled current ($\alpha I_{unit}$) to the sources of the cascode transistors M3 and M4, preventing M3 and M4 from being fully switched off when the scaled current is not routed through a particular cascode transistor. This can improve the switching speed of the cell 101 which may otherwise be degraded due to the addition of the cascode transistors M3 and M4. In some implementations, the gate terminals of transistors M9 and M10 are driven by a calibrated input labelled "swcas_ibias."

The differential switch pair 120 transistors M1 and M2 have effective capacitances, each having a gate-drain ($C_{gd}$) capacitance and a gate-source ($C_{gs}$) capacitance. The switching of transistors M1 and M2 entails transient current flow through their $C_{gd}$ and $C_{gs}$ capacitances. Since the source terminals of transistor pair M1 and M2 are connected at node swx, the transient charge released by $C_{gs}$ of the transistor turning off is absorbed by $C_{gs}$ of the transistor turning on. For example, if M1 is turning off and M2 is turning on, the charge developed at the source terminal of M1 will discharge into the source terminal of M2.

The $C_{gs}$ transient charge flow is contained between "in" and "inb" inputs through the common-source node swx of M1 and M2. Therefore, this transient charge flow does not interfere with the tail current ($I_{unit}$) switching action between M1 and M2. Note that during a current steering transition, the turning on of M2, for example, may happen slightly earlier than the turning off of M1. As a result, a tail current may momentarily provide a $C_{gs}$ current of the transistor turning on (M2) before the other transistor (M1) turns on.

In contrast to the $C_{gs}$ transient charge flow, the $C_{gd}$ transient charge flow can appear as a net differential transient current at the output of the cell 101 if left uncompensated (e.g., without the cross-coupled switch pair 125, which will be addressed further below). This uncompensated $C_{gd}$ transient charge flow can manifest itself in the output currents of a DAC cell in the following forms: large spikes on the net differential output currents of the cells, especially in LSB ones where tail ($I_{unit}$) current is notably smaller than these transient peaks (tens of microamperes compared to even sub-microamperes). Zero crossing instants of the differential output currents of the cells are modulated, especially in LSB DAC cells, by the uncompensated $C_{gd}$ transient current. The spread in these zero crossing instants can be viewed as a metric indicating the degree of presence of the $C_{gd}$ current in the net differential output current of a DAC cell. The $C_{gd}$ transient current is "code dependent" because its polarity depends on whether there is a binary 0-to-1 or a 1-to-0 transition at the cell input and it does not exist if there is no transition (e.g., the same input bit value for a particular cell remains the same). Note that linear operation of the differential switch pair 120 leads to larger value of $C_{gd}$ than that of saturation operation. Driving the differential switch pair 120 with CMOS levels can produce the steepest transitions. These extremely fast transitions can lead to significantly larger $C_{gd}$ currents (e.g., in the order of a few microamperes larger than a current associated with a LSB cell) during transitions.

To cancel the $C_{gd}$ transient charge flow, the cell 101 includes the cross-coupled switch pair 125. Here, the transistors M7 and M8 of the cross-coupled switch pair 125 are arranged within the cell 101 to reduce a net differential transient current between switch output terminals of the differential switch pair 120. Further, the addition of the cross-coupled switch pair 125 can eliminate the $C_{gd}$ transient charge from the output of DAC cell 101, which can yield higher linearity and spectral purity.

Nodes swyn and swyp are respectively coupled with non-gate terminals of the M1 and M2 transistors, which are the drain terminals of M1 and M2 in this example. Further, nodes swyn and swyp are respectively coupled with the drain terminals of the M8 and M7 transistors. As M1 traverses, for example, from an on-state to an off-state, its time-varying $C_{gd}$ delivers a net charge to node swyn, which is absorbed by the $C_{gd}$ of M8, traversing via the exact opposite states of operation as M1 due to its inverted input (inb instead of in). Similarly, as M2 traverses from an off-state to an on-state, its time-varying $C_{gd}$ absorbs a net charge from node swyp, the charge being supplied by the $C_{gd}$ of M7, while traversing through the opposite regions of operation as M2. This approach can prevent the $C_{gd}$ transient current from interfering with the output current of the cell 101. In some implementations, transistors M7 and M8 are nominally the same size as transistors M1 and M2 to ensure matching of their respective parasitic capacitances.

The source terminals of M7 and M8 are coupled together via node cmx. Unlike node swx, node cmx is not coupled with a common voltage source such as $AV_{DD}$. The $C_{gs}$ transient charge flow of M7 and M8 is contained within the node cmx pathway between the source terminals of M7 and M8, where their respective gate terminals are driven by the "in" and "inb" inputs, and does not interfere with a differential output current of the cell 101. Further, node cmx takes the voltage of node swyn of the switched-off branch while common-source node of input switch pair (swx) takes the voltage of node swyp of the switched-on branch. Alternatively, node cmx takes the voltage of node swyp of the switched-off branch while common-source node of input switch pair (swx) takes the voltage of node swyn of the switched-on branch.

The cell 101 produces outputs labelled "out" and "outb" based on the outputs of the differential switch pair 120 and a cross-coupled switch pair 125 and further refinement by transistors M3 and M4. The cell 101 output terminals can be coupled with an I-V converter 140 which converts current (I) to a voltage (V). In some implementations, the I-V converter 140 is coupled with multiple cells including cell 101. In some implementations, there is an I-V converter 140 for each cell. In some implementations, the I-V converter 140 includes a pair of resistors coupled between output terminals of cell 101 and ground, such that the output terminals provide a corresponding voltage.

In some implementations, a DAC includes CMOS buffers that provide steep output transitions, reducing the effects of mismatches in the switch drivers, clock jitter, and device and supply noise. However, these CMOS buffers can exacerbate the coupling of the input signal transitions to the output due to the rail-to-rail voltage swings and increased $C_{gd}$ of the linear-mode switches. For instance, the combined effect of the rail-to-rail swing (0-1V), small transition times (~30 ps), and $C_{gd}$ (~1 fF) can lead to code-dependent current injection in the order of 10 μA from the drivers to the output in a unit cell whose current is only about 1 μA, which is set by design requirements. This can impose a constraint on the lower bound of the acceptable current range for a LSB cell when minimizing CDST. However, the use of a cross-coupled switch as described herein can reduce or eliminate the code-dependent current injection.

In some implementations, the pole associated with nodes swyp/swyn is designed to ensure fast settling of a cell's output current and to minimize channel length of the switch-cascodes. However, this trades with a lower direct current (DC) output impedance of a DAC cell. As a trade-off, thin-oxide p-Channel field-effect transistors (pFETs) with $3L_{min}$ for M3/M4 can be used. In some implementations, M9 and M10 are operated in saturation to present minimum parasitic capacitance to swyp/swyn nodes.

Figure 2:
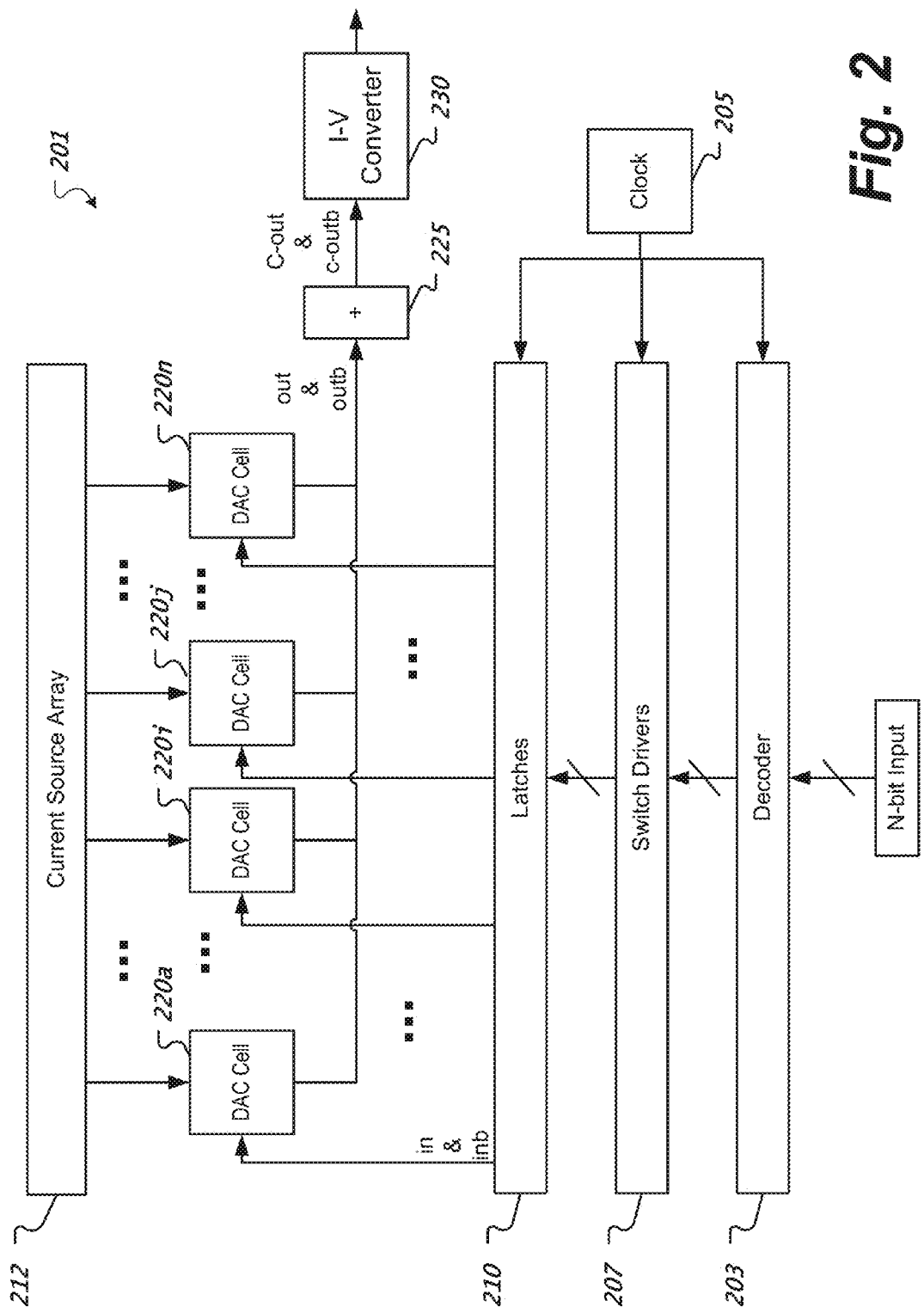
FIG. 2 shows an architecture of a DAC that includes multiple cells.

FIG. 2 shows an architecture of a DAC 201 that includes multiple cells 220a-220i, 220j-220n. The DAC 201 includes a decoder 203, clock 205, switch drivers 207, latches 210, DAC cells 220a-220i, 220j-220n, current source array 212, combiner 225, and I-V converter 230. In some implementations, the DAC 201 is implemented in a single integrated circuit. One or more of the DAC cells 220a-220n can include a differential switch pair and a cross-coupled switch pair, as arranged and described according to FIG. 1, to generate output currents ("out" and "outb"). In some implementations, inclusion of a cross-coupled switch pair within a cell 220a-220n is based on a cell's bit significance and corresponding control of current.

The decoder 203 receives and decodes an n-bit digital input. The decoder 203 provides a decoded output to the switch drivers 207. In some implementations, the switch drivers 207 include retimers. The switch drivers 207 can drive latches 210. In some implementations, the latches 210 are low crossing fast latches. The latches 210 can be configured to output a signal for a predetermined amount of time based on an input, the predetermined amount of time is based on a how long the DAC cells 220a-220n require to settle on a stable output value. In some implementations, the switch drivers 207 include inverters to generate the inverted input signal for the DAC cells 220a-220n, and the latches 210 include latches for the input signal and latches for the inverted input signal. The clock 205 can provide a clock signal to various components of the DAC 201 including the decoder 203, switch drivers 207, and latches 210.

In this example, the cells 220a-n are assigned to respective bit positions of a digital input value provided to the DAC 201. The DAC cells are partitioned into "MSB" cells 220a-220i and "LSB" cells 220j-220n which correspond to MSB and LSB portions of an n-bit digital input, in particular MSB cell 220a processes the MSB of the digital input and LSB cell 220n processes the LSB of the digital input. Further, the cells 220a-n handle different amounts of source current. The MSB cell 220a controls the most amount of current in this example, whereas, LSB cell 220n controls the least. The current source array 212 provides different source currents to the cells 220a-n respectively, such that the cells 220a-n are able to control different amounts of current. A provided source current can correspond to an assigned bit position of a cell 220a-n. In some implementations, the MSB cells 220a-220i use thermometer-coding due to its differential nonlinearity (DNL), glitch energy, and monotonicity advantages, while the LSB cells 220j-220n use binary-coding to due its compactness and simplicity advantages.

A combiner 225 sums the output currents of each cell 220a-n to output combined output currents. In some implementations, the combiner includes a first electrical junction that is coupled with the "out" outputs of each cell 220a-n and a second electrical junction that is coupled with the "outb" outputs of each cell 220a-n. The combined currents ("c-out" and "c-outb") are provided to the I-V converter 230. The I-V converter 230 generates a voltage output that corresponds to the n-bit digital input.

Figure 3:
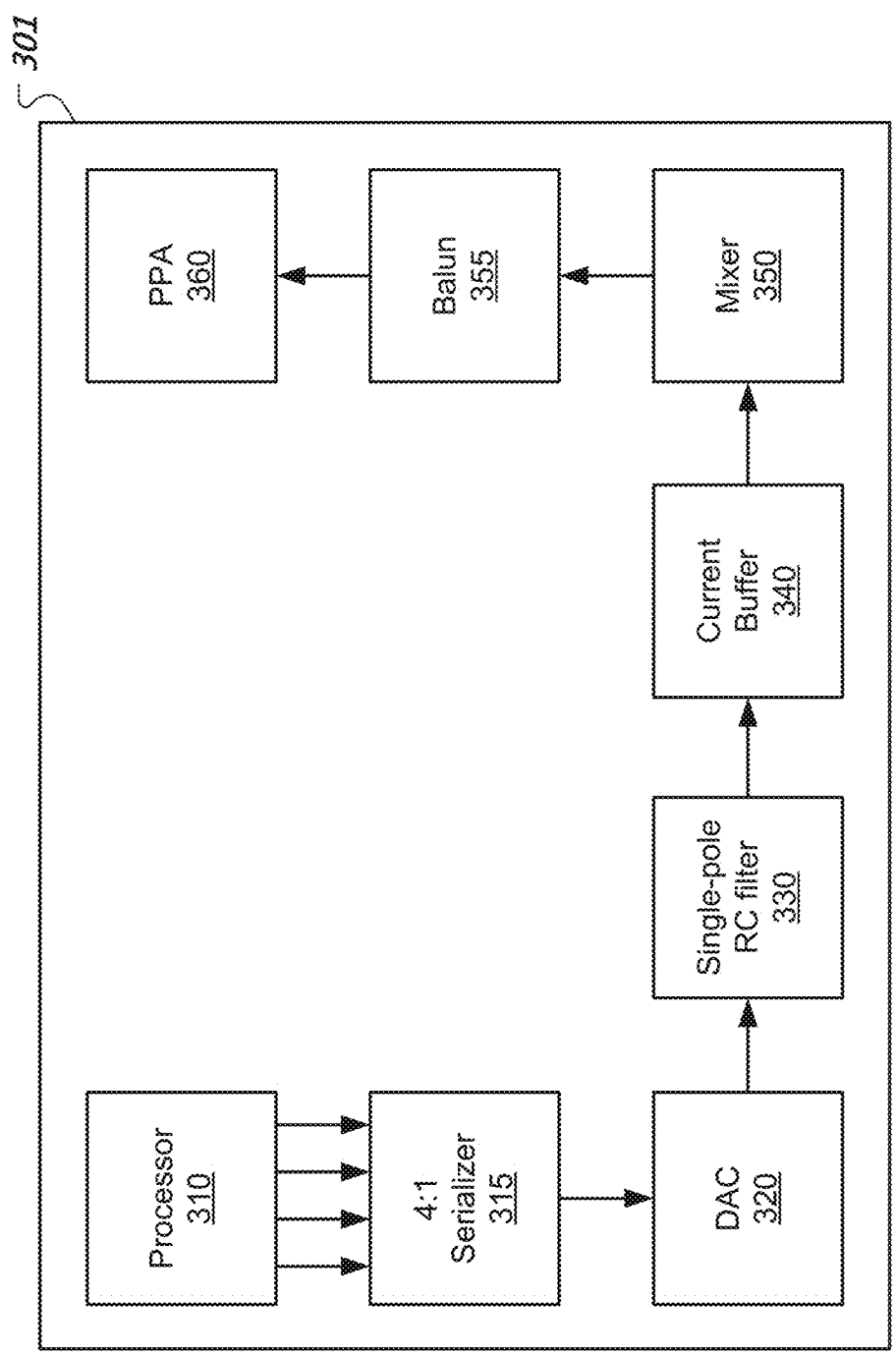
FIG. 3 shows an architecture of a communications chip that includes a DAC.

FIG. 3 shows an architecture of a communications chip 301 that includes a DAC 320. The chip 301 includes a processor 310 that outputs digital values for transmission over the air. Such digital values can be 10-bit values. In some implementations, a digital backend including the processor 310 outputs values via four parallel streams. A 4:1 serializer 315 can convert the four parallel 10-bit streams into one higher rate 10-bit stream. This allows the digital backend to operate at a lower rate than the DAC 320.

The single data stream is fed into the DAC 320. The DAC 320 can include a 4b+6b segmented current-steering DAC where the input data stream has been retimed at 2.56 GS/s, decoded, and retimed again before being applied to the gates of the current-steering switches of the cells of the DAC 320. In some implementations, the "4b+6b" notation indicates a DAC 320 that includes four thermometer-coded segments (which can be implemented by 15 MSB switches) and six binary coded segments (which can be implemented by 6 LSB switches). The DAC 320 can be implemented using such current steering cells in a 28 nm CMOS process.

The differential output from DAC 320 is filtered using a simple low-cost single-pole RC filter 330 and buffered via current buffer 340. The output of the current buffer 340 is up-converted via mixer 350 and amplified by a pre-power amplifier (PPA) 360. A balun 355 is coupled between the mixer 350 and the PPA 360. The output of the PPA 360 can be coupled to a pin output of the chip 301. In some implementations, the processor 310 outputs values for an in-phase (I) signal and a quadrature (Q) signal. In some implementations, circuitry such as serializer 315, DAC 320, filter 330, and current buffer 340 can be duplicated for each of the I and Q pathways.

Figure 4:
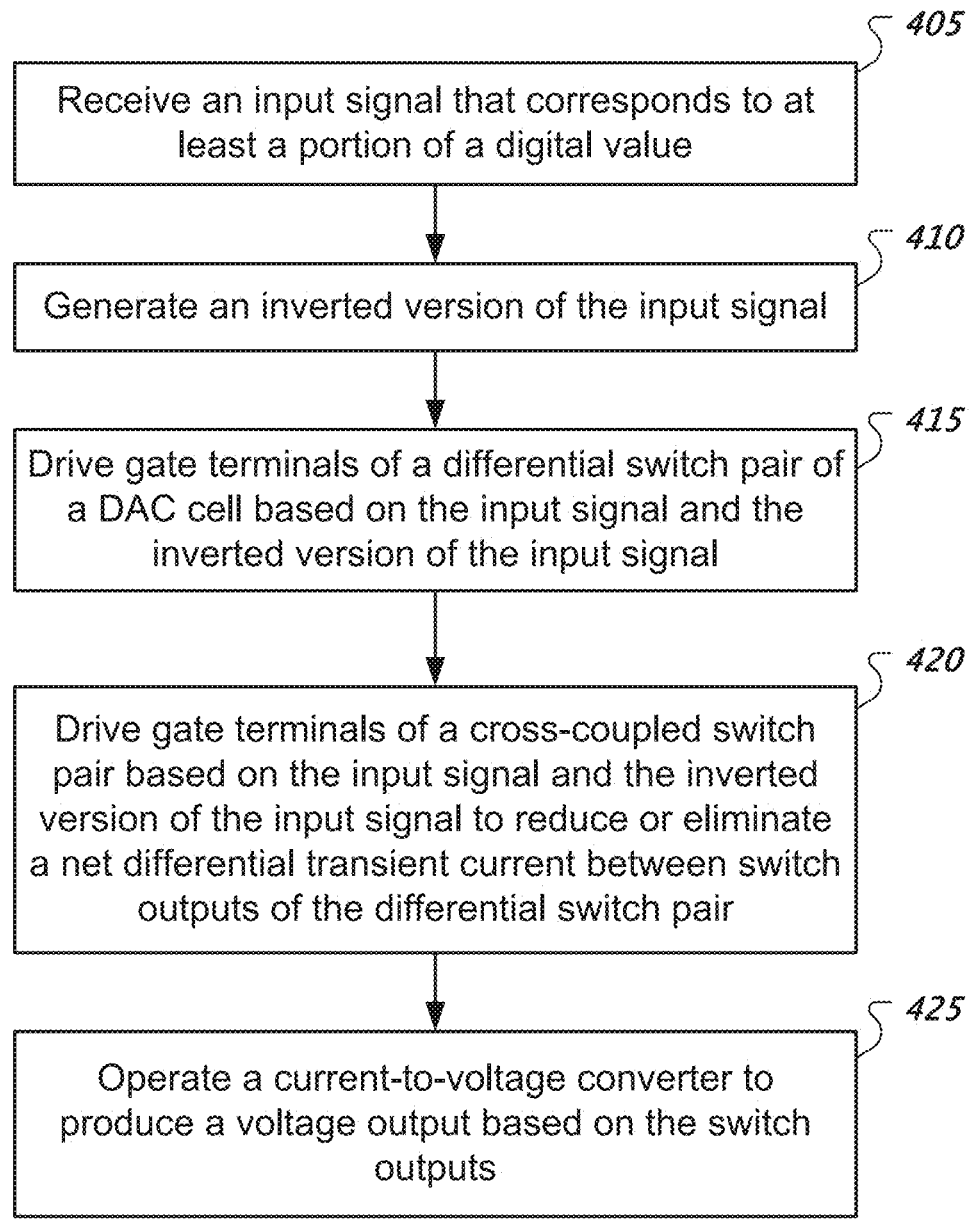
FIG. 4 shows a flowchart of an example of a process to operate a DAC cell.

FIG. 4 shows a flowchart of an example of a process to operate a DAC cell. At 405, the process receives an input signal that corresponds to at least a portion of a digital value. For example, the input signal can correspond to a specific bit within an n-nit digital value. At 410, the process generates an inverted version of the input signal. At 415, the process drives gate terminals of a differential switch pair of a DAC cell based on the input signal and the inverted version of the input signal. Driving gate terminals of a differential switch pair can include providing the input signal to a gate terminal of a transistor and providing the inverted version to a gate terminal of another transistor within the pair. At 420, the process drives gate terminals of a cross-coupled switch pair based on the input signal and the inverted version of the input signal to reduce or eliminate a net differential transient current between switch outputs of the differential switch pair. Driving gate terminals of a cross-coupled switch pair can include providing the input signal to a gate terminal of a first transistor of the cross-coupled switch pair and providing the inverted version to a gate terminal of a second transistor of the cross-coupled switch pair. At 425, the process operates a current-to-voltage converter to produce a voltage output based on the switch outputs.

Figure 5:
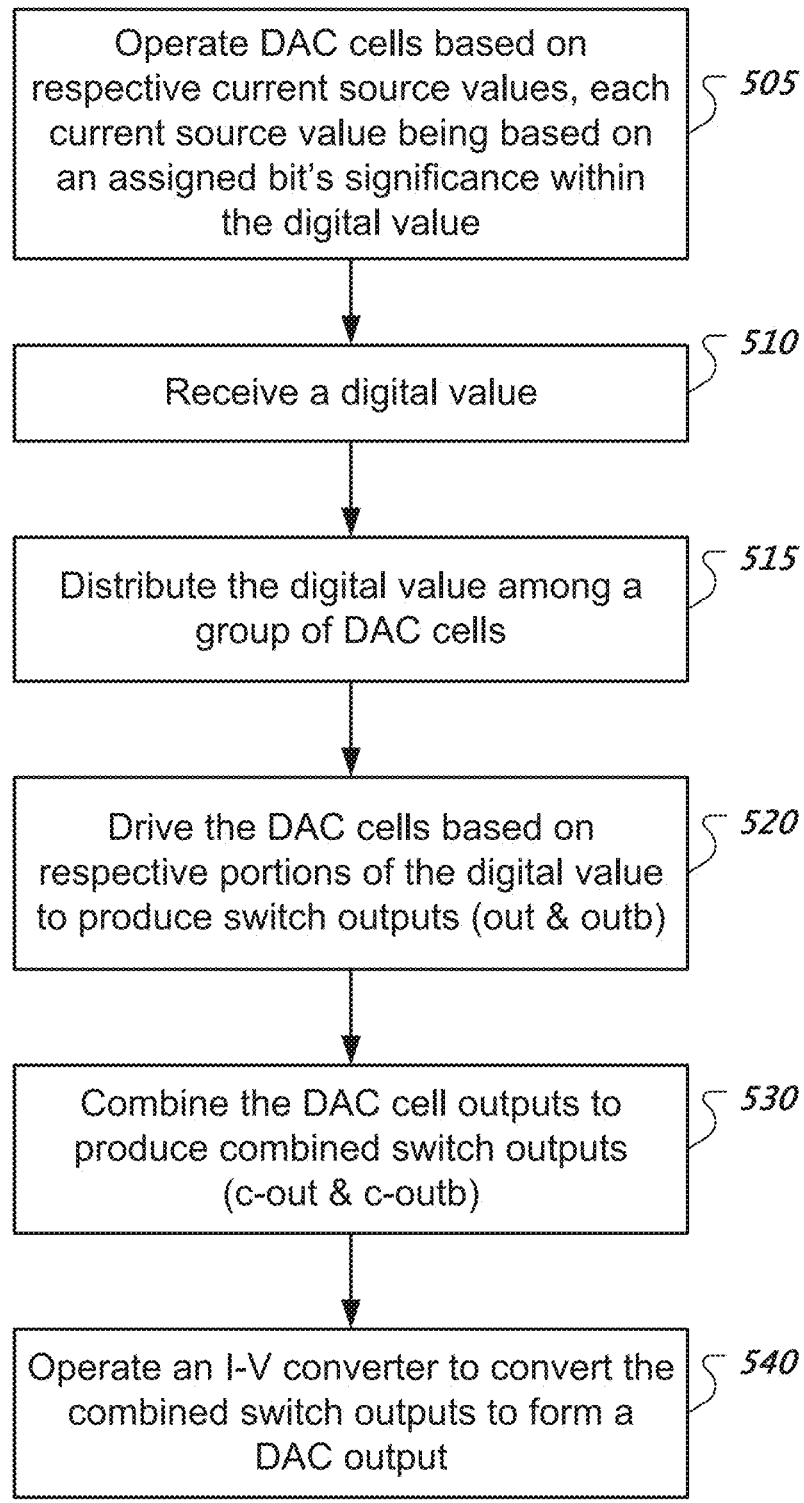
FIG. 5 shows a flowchart of an example of a DAC process that operates multiple DAC cells to convert a digital input.

FIG. 5 shows a flowchart of an example of a DAC process. At 505, the process operate DAC cells based on respective current source values, each current source value being based on an assigned bit's significance within the digital value. One or more of the DAC cells can include a differential switch pair and a cross-coupled switch pair that is arranged to cancel a transient current flow associated with the differential switch pair. At 510, the process receives a digital value. At 515, the process distributes the digital value among a group of DAC cells. In some implementations, the process loads bit values of an n-bit value into respective latches. At 520, the process drives the DAC cells based on respective portions of the digital value to produce switch outputs (out and outb). An example of a process for such DAC cell driving is provided by FIG. 4. At 530, the process combines the DAC cell outputs to produce combined switch outputs (e.g., c-out and c-outb). At 540, the process operates an I-V converter to convert the combined switch outputs to form a DAC output.

Figure 6A:
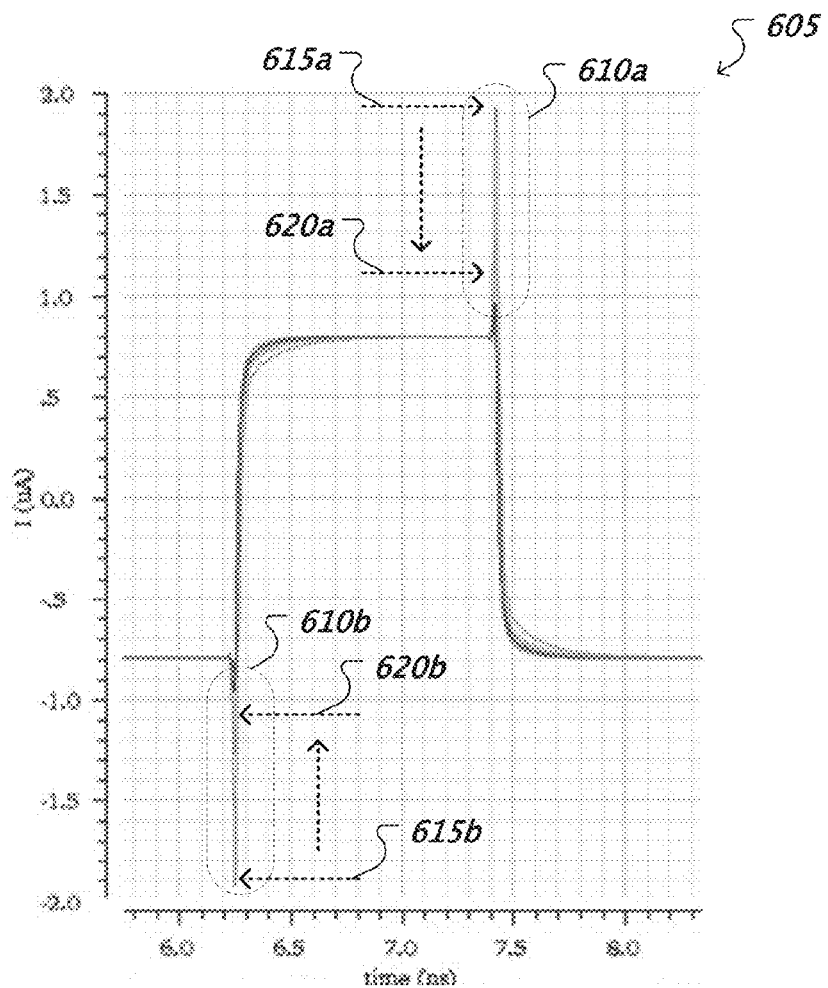
FIG. 6A shows a graph of an example of waveforms produced by uncompensated cells of a DAC.

FIG. 6A shows a graph 605 of an example of waveforms produced by uncompensated cells of a DAC. The uncompensated cells include differential switch pairs without a cross-coupled switch pair of FIG. 1. The waveforms in the graph 605 represent a summation of a respective cell's switch outputs ("out" and "outb") over time. The peaks 615a, 615b shown in regions 610a, 610b are due to a lack of compensation for the $C_{gd}$ transient current between switches of a cell's differential switch pair. The peaks 615a-b are based on a sum of both switch outputs of the differential switch pair. In particular, a timing mismatch between the input signal and the inverted input signal causes both switches of the pair to be on which allows current to flow through both switches. Adding a cross-coupled switch pair such as the pair of FIG. 1 to a differential switch pair can reduce (see new lower peaks 620a, 620b) or eliminate the magnitude of the peaks 615a-b. Note that the waveforms of graph 605 are scaled to fit in the same space since each cell is configured to produce a different absolute current output. As such, the unscaled versions of the peaks 615a, 615b of an uncompensated MSB cell are higher than the unscaled peaks of an uncompensated LSB cell, because the MSB cell controls more current.

Figure 6B:
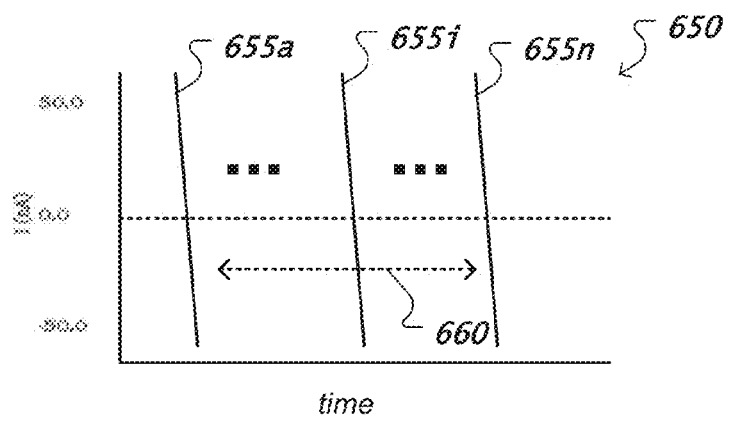
FIG. 6B shows a graph of an example of current transitions produced by different cells of a DAC.

FIG. 6B shows a graph 650 of an example of current transitions produced by different cells of a DAC. In this example, cells are assigned to control a range of respective currents, with each cell input transitioning from a zero to a one. The depiction of each current transition 655a, 665i, 655n shows a zero-crossing of a respective cell's current output. The graph 650 indicates a spread 660 among the zero-crossings. Ideally the spread 660 is zero, meaning the transition for all cells occurs at the same time. Coupling a differential switch pair with a cross-coupled switch pair such as the one shown in FIG. 1 can reduce or eliminate the spread 660 among cells.

Figure 7A:
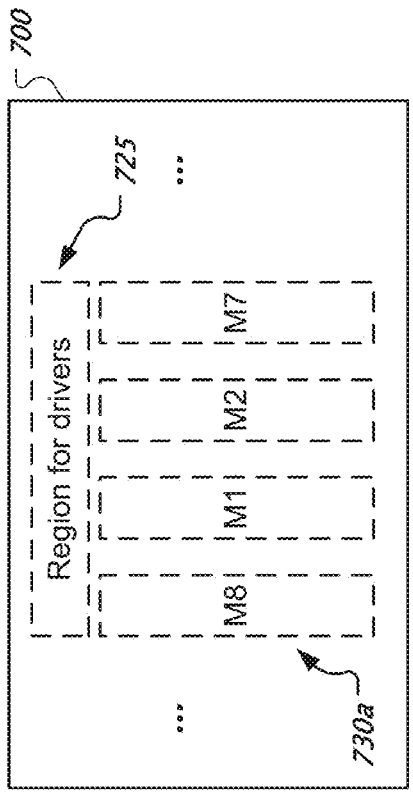
FIG. 7A shows an example of a chip layout of a DAC cell including a differential switch pair and a cross-coupled switch pair.
Figure 7B:
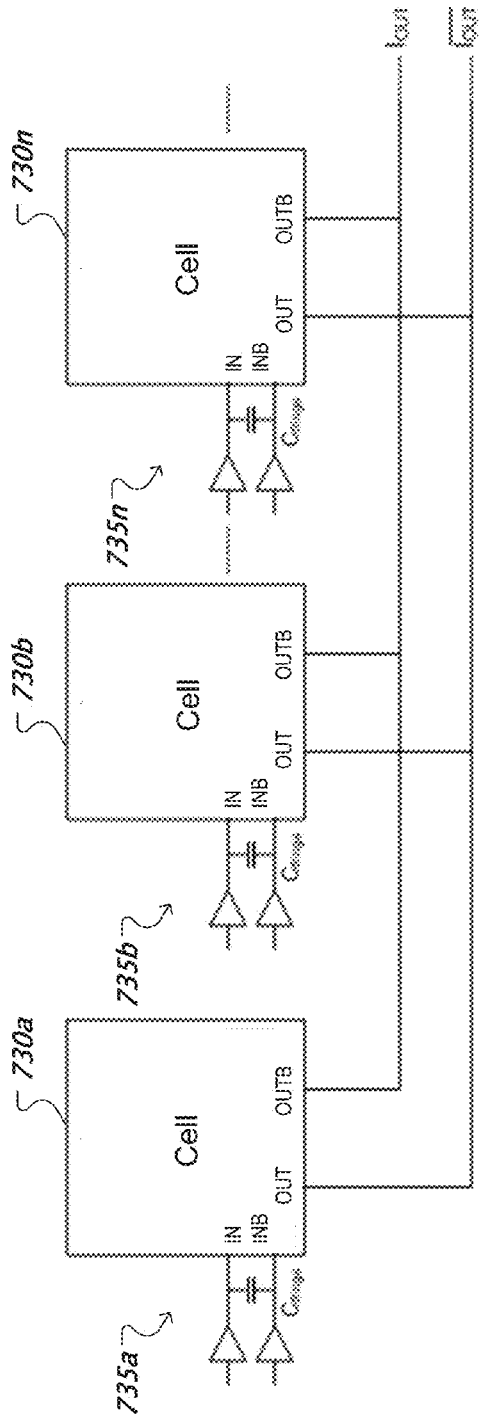
FIG. 7B shows how the DAC cell is arranged with other DAC cells.

FIG. 7A shows an example of a chip layout of a DAC cell 730a including a differential switch pair and a cross-coupled switch pair. Note that only select components of the DAC 730a cell are depicted. The DAC cell 730a is contained within a chip 700. As with FIG. 1, M1 and M2 form the differential switch pair, and M7 and M8 form the cross-coupled switch pair. The layout of the cell 730a shows that transistors M7 and M8 of the cross-coupled switch pair can be readily added on the sides of the M1 and M2 transistors, with minimal layout modifications. FIG. 7B shows how the DAC cell 730a is arranged with other DAC cells 730b, 730n within the chip 700 along with their respective drivers 735a, 735b, 735n.

Drivers 735a provide the input signals to M1, M2, M7, and M8 within DAC cell 730a. The input pair of M1 and M2 have different sizes in different current cells 730a-n, presenting unequal capacitive loading to their preceding drivers 735a-n. This can cause the zero crossing instants of the differential input signals at their gates to be different and, hence, the zero crossing instants of the differential output currents of the cells (e.g., the crossing at one cell may occur earlier than the crossing at another cell). This can lead to distortion in DAC output current ($I_{OUT}$) and, hence, harmonics at its spectrum. To eliminate this problem, a layout property can be exploited to create a fringe capacitance ($C_{fringe}$) at the input of each DAC cell 730a-n (see, for example, region 725 for cell 730a) such that the total capacitance presented to each driver 735a-n is substantially equal across all DAC cells 730a-n. $C_{fringe}$ can be defined as the fringe capacitance between a horizontal metal line within region 725, driving the gate of M2 and another horizontal metal line driving the gate of M1. Cell-by-cell, the spacing and length of these two lines in the DAC cell layout are adjusted such that the net capacitance presented to the drivers 735a-n of the DAC cells 730a-n are equal. As a results, a superior matching among zero crossing instants of the drivers differential output signals can be created.

In more detail, a metal fringe region 725 exists adjacent to the transistors M1, M2, M7, and M8. The metal fringe region 725 exhibits a fringe capacitance between differential inputs of the cell 730a. The fringe capacitance between switch gates routing of current cells can be tuned to balance the loading on the switch gate drivers. Such trimming can increase timing alignment among DAC cells output currents, which can further reduce distortion such as high frequency spurs. By tuning the parasitic metal fringe capacitance within the metal fringe region 725 for each cell 730a-n, the zero-crossing instants spread can be further reduced. For example, spreads of less than 2 ps with little or no power and area penalty are possible. Further, reducing the zero-crossing instants spread among cells, increases the temporal uniformity of cell transitions.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them). For example, a program can control one or more aspects of a DAC such as controlling calibration inputs, operational state, and/or decoding logic.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

What is claimed is:

1. A system comprising:
    a differential switch pair of a cell of a digital-to-analog converter, wherein gate terminals of the differential switch pair are arranged to respectively receive an input signal to the cell and an inverted version of the input signal to respectively drive the gate terminals of the differential switch pair;
    a cross-coupled switch pair coupled with the differential switch pair, wherein gate terminals of the cross-coupled switch pair are arranged to respectively receive the input signal and the inverted version of the input signal to respectively drive the gate terminals of the cross-coupled switch pair, wherein the cross-coupled switch pair is configured to reduce or eliminate a net differential transient current between switch output terminals of the differential switch pair, wherein respective source terminals of the cross-coupled switch pair are coupled together via a common node, wherein the common node is not coupled with a voltage source or a ground; and
    a current-to-voltage converter coupled with the switch output terminals of the differential switch pair, wherein the current-to-voltage converter is configured to generate a voltage that forms at least a portion of an output of the digital-to-analog converter.

2. The system of claim 1, wherein the differential switch pair comprises a first transistor and a second transistor, wherein a first terminal of the first transistor is coupled with the voltage source, wherein a first terminal of the second transistor is coupled with the voltage source, wherein the cross-coupled switch pair comprises a third transistor and a fourth transistor, wherein a gate of the first transistor and a gate of the third transistor are arranged to receive the input signal, and wherein a gate of the second transistor and a gate of the fourth transistor are arranged to receive the inverted version of the input signal.

3. The system of claim 2, wherein a source terminal of the third transistor is coupled with a source terminal of the fourth transistor, wherein a drain terminal of the first transistor is coupled with a drain terminal of the fourth transistor, and wherein a drain terminal of the second transistor is coupled with a drain terminal of the third transistor.

4. The system of claim 1, comprising:
    a switch pair coupled between the switch output terminals of the differential switch pair and the current-to-voltage converter to increase output impedance.

5. The system of claim 1, wherein the digital-to-analog converter comprises two or more cells, wherein the two or more cells comprise the cell, wherein the two or more cells are assigned to respective bit positions of a digital input value provided to the digital-to-analog converter, and wherein the two or more cells are configured to control different current amounts that correspond to the respective bit positions.

6. The system of claim 5, wherein the current-to-voltage converter is arranged to receive a combination of outputs from the two or more cells to produce a combined voltage, wherein the combined voltage is an analog representation of the digital input value.

7. The system of claim 5, wherein the two or more cells are formed on a single integrated circuit chip that is susceptible to parasitic metal fringe capacitances, and wherein a parasitic metal fringe capacitance between differential switch pair input terminals for each of the two or more cells has been tuned to compensate for capacitive mismatches among the two or more cells.

8. The system of claim 7, wherein the system is the single integrated circuit chip.

9. An apparatus comprising:
a first transistor of a differential switch pair of a cell of a digital-to-analog converter, wherein a gate of the first transistor of the differential switch pair is arranged to receive an input signal to the cell;
a second transistor of the differential switch pair, wherein a gate of the second transistor of the differential switch pair is arranged to receive an inverted version of the input signal;
a first transistor of a cross-coupled switch pair, wherein a gate of the first transistor of the cross-coupled switch pair is arranged to receive the input signal;
a second transistor of the cross-coupled switch pair, wherein a gate of the second transistor of the cross-coupled switch pair is arranged to receive the inverted version of the input signal;
a first node coupled with i) a non-gate terminal of the first transistor of the differential switch pair and ii) a first non-gate terminal of the second transistor of the cross-coupled switch pair;
a second node coupled with i) a non-gate terminal of the second transistor of the differential switch pair and ii) a first non-gate terminal of the first transistor of the cross-coupled switch pair; and
a current-to-voltage converter coupled with the first node and the second node to produce an output voltage that corresponds to the input signal,
wherein a second non-gate terminal of the first transistor of the cross-coupled switch pair is coupled with a second non-gate terminal of the second transistor of the cross-coupled switch pair via a common node, wherein the common node is not coupled with a voltage source or a ground.

10. The apparatus of claim 9, wherein a source terminal of the first transistor of the differential switch pair is coupled with the voltage source, wherein a source terminal of the second transistor of the differential switch pair is coupled with the voltage source.

11. The apparatus of claim 10, wherein the second non-gate terminal of the first transistor of the cross-coupled switch pair comprises a source terminal, and wherein the second non-gate terminal of the second transistor of the cross-coupled switch pair comprises.

12. The apparatus of claim 9, comprising:
a switch pair coupled between the first and second nodes and the current-to-voltage converter to increase output impedance.

13. The apparatus of claim 9, wherein the digital-to-analog converter comprises two or more cells, wherein the two or more cells comprise the cell, wherein the two or more cells are assigned to respective bit positions of a digital input value provided to the digital-to-analog converter, and wherein the two or more cells are configured to control different current amounts that correspond to the respective bit positions.

14. The apparatus of claim 13, wherein the current-to-voltage converter is arranged to receive a combination of outputs from the two or more cells to produce a combined voltage, wherein the combined voltage is an analog representation of the digital input value.

15. The apparatus of claim 13, wherein the two or more cells are formed on a single integrated circuit chip that is susceptible to parasitic metal fringe capacitances, and wherein a parasitic metal fringe capacitance between differential switch pair input terminals for each of the two or more cells has been tuned to compensate for capacitive mismatches among the two or more cells.

16. A method comprising:
receiving, within a cell of a digital-to-analog converter, an input signal that corresponds to at least a portion of a digital value;
generating an inverted version of the input signal;
driving gate terminals of a differential switch pair of the cell based on the input signal and the inverted version of the input signal;
driving gate terminals of a cross-coupled switch pair of the cell based on the input signal and the inverted version of the input signal to reduce or eliminate a net differential transient current between switch output terminals of the differential switch pair, wherein respective source terminals of the cross-coupled switch pair are coupled together via a common node, wherein the common node is not coupled with a voltage source or a ground; and
operating a current-to-voltage converter to produce a voltage output based on the switch output terminals.

17. The method of claim 16, comprising:
operating a switch pair coupled between the switch output terminals of the differential switch pair and the current-to-voltage converter to increase output impedance.

18. The method of claim 16, comprising:
operating two or more cells to convert a digital input value, wherein the two or more cells comprise the cell, wherein the two or more cells are assigned to respective bit positions of the digital input value, and wherein the two or more cells are configured to control different current amounts that correspond to the respective bit positions.

19. The method of claim 16, wherein the differential switch pair comprises a first transistor and a second transistor, wherein a first terminal of the first transistor is coupled with the voltage source, wherein a first terminal of the second transistor is coupled with the voltage source, wherein the cross-coupled switch pair comprises a third transistor and a fourth transistor, wherein a gate of the first transistor and a gate of the third transistor are arranged to receive the input signal, and wherein a gate of the second transistor and a gate of the fourth transistor are arranged to receive the inverted version of the input signal.

20. The method of claim 19, wherein a source terminal of the third transistor is coupled with a source terminal of the fourth transistor.

* * * * *